United States Patent [19]
Torreno, Jr. et al.

[11] 3,982,269
[45] Sept. 21, 1976

[54] SEMICONDUCTOR DEVICES AND METHOD, INCLUDING TGZM, OF MAKING SAME

[75] Inventors: Manuel L. Torreno, Jr., Schenectady, N.Y.; Bruno F. Kurz, deceased, late of Schenectady, N.Y., by Elizabeth Kurz-Beerli, executrix; Surinder Krishna, Ballston Lake, N.Y.

[73] Assignee: General Electric Company, Schenectady, N.Y.

[22] Filed: Nov. 22, 1974

[21] Appl. No.: 526,225

[52] U.S. Cl. .................... 357/60; 357/48; 148/1.5; 357/89; 357/90; 357/91
[51] Int. Cl.² ............... H01L 29/04; H01L 27/04; H01L 7/00
[58] Field of Search ............... 357/40, 48, 60, 91, 357/89, 90

[56] References Cited
UNITED STATES PATENTS
3,602,781   8/1971   Hart .................... 357/91

*Primary Examiner*—Edward J. Woiciechowicz
*Attorney, Agent, or Firm*—Donald M. Winegar; Joseph T. Cohen; Jerome C. Squillaro

[57] ABSTRACT

A homogeneous integrated power structure embodies solid state control or signal devices and power devices integrated monolithically to achieve optimum physical characteristics of each device embodied therein at economical cost of manufacturing the same. The devices are electrically isolated from each other by a P-N junction isolation grid produced by the thermomigration of metal-rich wires through a semiconductor substrate by thermal gradient zone melting processing techniques.

11 Claims, 6 Drawing Figures

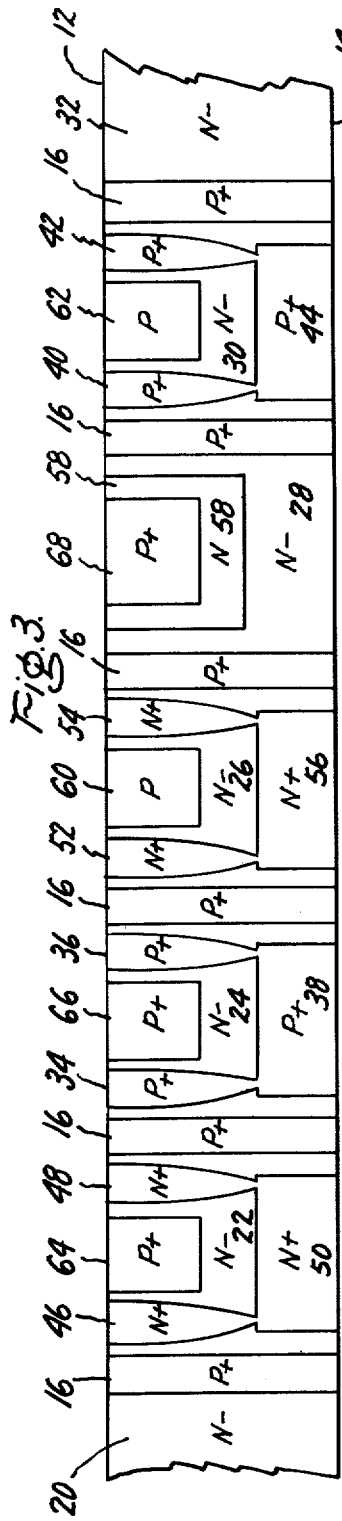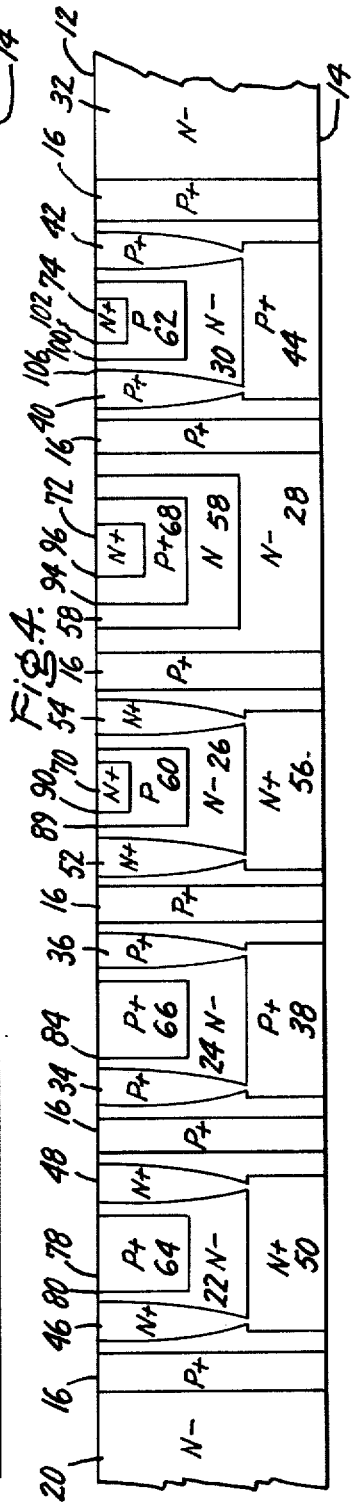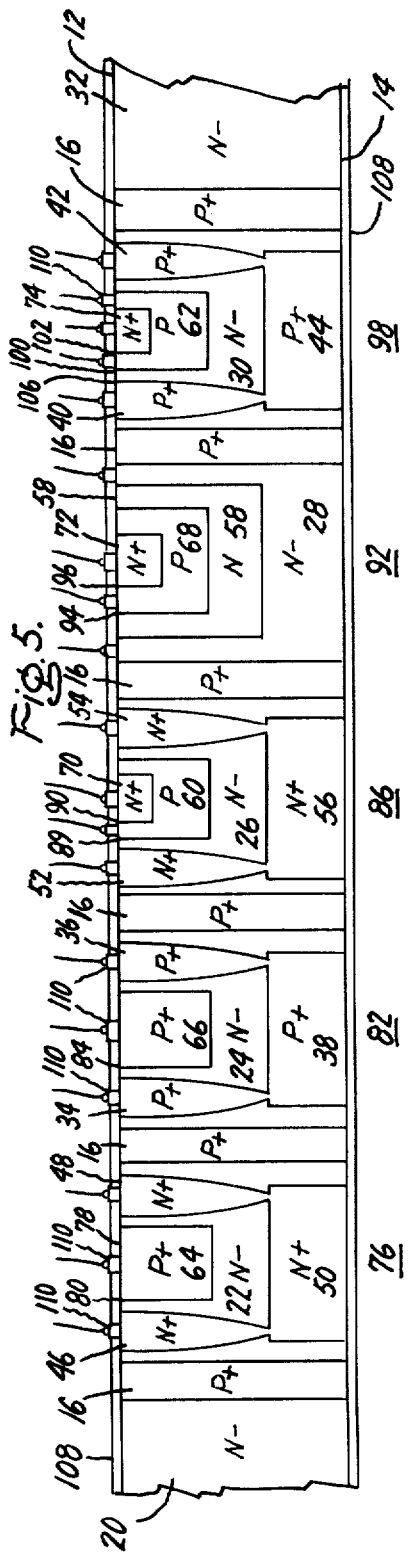

SEMICONDUCTOR DEVICES AND METHOD, INCLUDING TGZM, OF MAKING SAME

BACKGROUND OF THE INVENTION

1. Field of the Invention

This invention relates to integrated circuits and, in particular, to a homogeneous integrated power structure which embodies both control or signal devices and power devices integrated monolithically therein.

2. Description of the Prior Art

Heretofore, integrated circuits embodying both control signal devices (less than 500 volts and 1 ampere) and power devices (500 volts or greater and 1 ampere or greater) in the same structure have been difficult and costly to manufacture. High resistivity semiconductor material is employed as a common substrate for all devices to be made in the circuit. Any required buried layers of the circuit are formed by diffusion into the substrate. An epitaxial layer of semiconductor material of suitable resistivity and thickness is grown on the substrate to provide material for power devices. For a 600 volt power device, the epitaxial layer is approximately 65 microns in thickness and has a dopant concentration of approximately $3 \times 10^{14}$ atoms per cubic centimeter. Suitable diffusion processes follow to provide electrical isolation and electrical contacts to the buried layers. One or more signal devices and the base and emitter for the power devices are then fabricated in the epitaxially grown material by diffusion processing techniques.

However, the high quality, high lifetime semiconductor material, of the order of about 100 microsecond, necessary for fabricating power devices is extremely difficult to grow epitaxially and prohibitively costly. The normal lifetime for epitaxial material on a degenerate substrate is of the order of from 1 to 5 microsecond. The effects of a low lifetime on power devices include high forward drops, $V_F$, and lower voltage surge capability for semiconductor controlled rectifiers and rectifiers. In addition, transistors fabricated in the epitaxially grown semiconductor material have a low high current gain, $h_{FE}$, high quasisaturation resistance, and less efficiency. Photo diodes fabricated in the same material have lower sensitivity and low efficiency ratings and contamination levels of less than $3 \times 10^{14}$ atoms per cubic centimeter. Uncompensated material is probably unattainable on any reproducible scale and at any reasonable cost.

Additionally, it has been found by the prior art method that a vertical semiconductor controlled rectifier cannot be fabricated in the integrated circuit. The lateral semiconductor controlled rectifiers which are fabricated in the epitaxially grown material have high current densities which result from the flow of currents along restricted surface areas. Likewise, only lateral transistors are capable of being manufactured in the integrated circuit and a severe tradeoff must be made between the breakdown voltage and the current gain of the transistor. Power transistors must work at low current densities, and therefore, the physical dimensions of such transistors becomes very large to handle designed current requirements for the desired circuit.

In a co-pending patent application entitled "Homogeneous Integrated Power Structures", Ser. No. 526,226, filed the same day as this patent application and assigned to the same assignee, Krishna and Kurz teach the fabrication of power and signal or control semiconductor devices in the same body of semiconductor material. The devices fabricated in a homogeneous integrated power structure are electrically isolated from each other by one or more P-N junction regions. Each P-N junction region is formed by a double diffusion process step. The diffusion process time is of the order of 140 to 160 hours in length. A long furnace time at an elevated temperature of 1200°C to 1250°C is detrimental to the minority carrier lifetime and results in a decrease of the same. In addition, mismatches in the alignment of diffusion masks cause the P-N junctions regions to encroach upon the regions of material reserved for device manufacture. Further, the P-N junction regions which are formed are not uniform in resistivity throughout the region and have an hourglass configuration.

It is therefore an object of this invention to provide a new and improved integrated circuit embodying power and signal or control devices monolithically integrated into a common structure and electrically isolated from each other by one or more P-N junction regions having a substantially constant uniform width and resistivity throughout the region.

Another object of this invention is to provide high lifetime, high quality, and relatively inexpensive homogeneous semiconductor material in making new and improved integrated circuits embodying power and signal or control devices in a common monolithic substrate and electrically isolated from each other by one or more P-N junction regions having a substantially uniform width and resistivity throughout the region.

Other objects of this invention will, in part, be obvious and will, in part, appear hereinafter.

SUMMARY OF THE INVENTION

In accordance with the teachings of this invention, there is provided a homogeneous power structure. The structure comprises a body of single crystal semiconductor material having two major opposed parallel surfaces comprising the top and bottom surfaces thereof. The body of material has a selected resistivity, a selected first type conductivity and a selected level of minority carrier lifetime.

A plurality of either non-intersecting, intersecting, or both, first regions of second and opposite type conductivity formed in the body and divides the body into a plurality of second regions, each of which has first type conductivity. Each first region has a substantially constant width and selected level of resistivity for its entire length and extends between and terminates in the top and bottom surfaces of the body. Each first region has two major surfaces which are coextensive with the respective top and bottom surfaces of the body. A P-N junction is formed by the abutting surfaces of each pair of mutually adjacent regions of first and second regions of opposite type conductivity. Each second region is electrically isolated from mutually adjacent second regions by selected one of the first regions.

At least one signal or control semiconductor device is formed in selected ones of the plurality of second regions. At least one power semiconductor device is formed in other selected ones of the plurality of second regions. Electrical contacts are affixed to respective selected surface areas of the semiconductor devices for connecting them into an electrical circuit arrangement. All deep diffusions, both N and P type, are processed sequentially for predeposition of dopant material and simultaneously diffused in one or more separate process steps to form various regions of the devices in the body.

DESCRIPTION OF THE DRAWINGS

FIGS. 1 through 5 are elevation views, partly in cross-section, of a body of semiconductor material being processed in accordance with the teachings of this invention;

DESCRIPTION OF THE INVENTION

Figure 1:
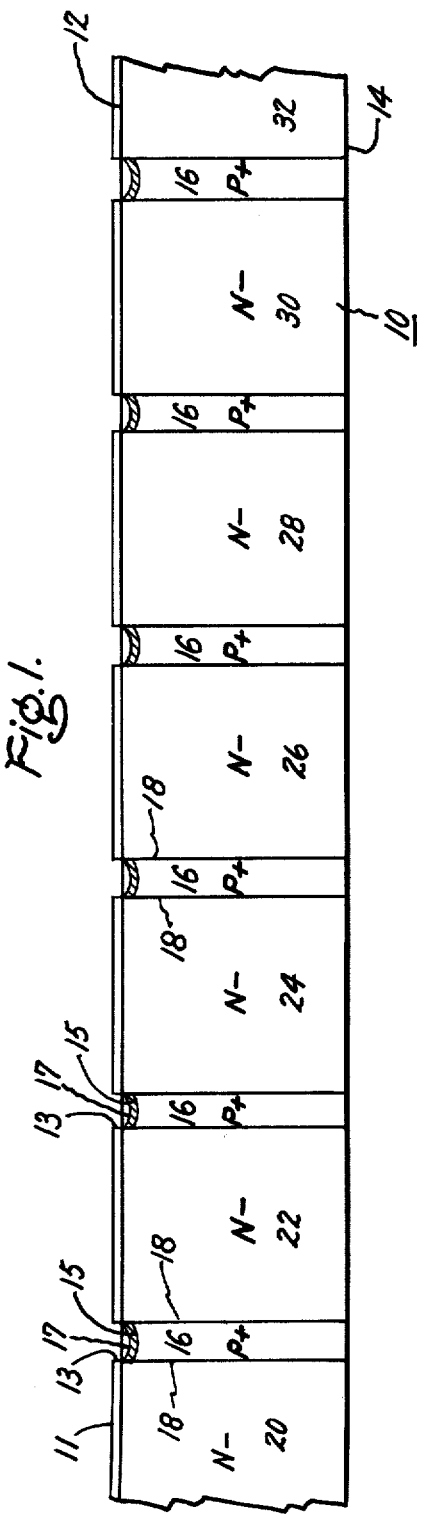

With reference to FIG. 1, there is shown a body 10 of single crystal semiconductor material having two major opposed surfaces 12 and 14 which are substantially parallel to each other and are, respectively, the top and bottom surfaces of the body. The semiconductor material comprising the body 10 my be silicon, germanium, silicon carbide, gallium arsenide, a semiconductor compound of a Group II element and a Group VI element and a semiconductor compound of a Group III element and a Group V element and have N or P type conductivity. In order to describe the invention more fully, the body 10 is said to be of silicon semiconductor material having an N-conductivity.

The thickness of the body 10 varies in accordance with the power devices to be fabricated therein. Allowance must be made for the voltage requirement of the power devices, base widths and collector and emitter depths. The body 10 has an extremely low oxygen content and substantially no silicon oxide inclusions included therein. It is desirable that the body 10 have good damage free material in the interior thereof since the power devices fabricated therein have deep junctions and high field voltages which are of the order of greater than 200 volts and preferably from 500 volts to 1000 volts or even higher. The lifetime of the material of the body is of the order of approximately 100 microseconds.

The material of the body 10 preferably has a resistivity which enables one to achieve a theoretical voltage breakdown which is approximately 50 percent greater than the required minimum breakdown voltage for the power device to be fabricated therein. For example, it is desirable to have material having an approximate resistivity of 15 ohm-centimeter for a 300 breakdown voltage device, 25 ohm-centimeter for a 500 volt device and 40 ohm-centimeter for a 1000 volt device.

The body 10 of silicon is mechanically polished, chemically etched to remove any damaged surfaces, rinsed in deionized water and dried in air. An acid resistant mask 11 is disposed on the surface 12 of the body 10. Preferably, the mask is of silicon oxide which is either thermally grown or vapor deposited on the surface 12 by any of the methods well known to those skilled in the art. Employing well known photolithographical techniques, a photoresist, such, for example, as Kodak Metal Etch Resist, is disposed on the surface of the silicon oxide layer 11. The resist is dried by baking at a temperature of about 80°C. A suitable mask of spaced lines of a predetermined thickness and spaced a predetermined distance apart is disposed on the layer of photoresist. The masked body is then exposed to ultraviolet light. After exposure, the layer of photoresist is washed in a developing solvent to open windows 13 in the masking layer to expose selected surface areas of the oxide layer 11 therein.

Selective etching of the layer 11 of silicon oxide is accomplished with a buffered hydrofluoric acid solution ($NH_4F$—HF). The etching is continued until a second set of windows corresponding to the windows of the photoresist mask are opened in the layer 11 of silicon oxide to expose selective portions of the surface 12 of the body 10 of silicon. The processed body 10 is rinsed in deionized water and dried. The remainder of the photoresist mask is removed by immersion in concentrated sulphuric acid at 180°C or immersion in a mixture of 1 part by volume hydrogen peroxide and 1 part by volume concentrated sulphuric acid.

Selective etching of the exposed surface areas of the body 10 is accomplished with a mixed acid solution. The mixed acid solution is 10 parts by volume nitric acid, 70%, 4 parts by volume acetic acid, 100%, and 1 part by volume hydrofluoric acid, 58%. At a temperature of from 20°C to 30°C, the mixed acid solution selectively etches the silicon of the body 10 at a rate of approximately 5 microns per minute. A trough 15 is etched in the surface 12 of the body 10 beneath each window of the oxide layer 11. The selective etching is continued until the depth of the trough 15 is approximately equal to the width of the window in the silicon oxide layer 11. However, it has been discovered, that the trough 15 should not be greater than approximately 100 microns in depth because undercutting of the silicon oxide layer 11 will occur. Undercutting of the layer 11 of silicon oxide has a detrimental effect on the width of the metal "wire" to be migrated through the body 10. Etching for approximately 5 minutes at a temperature of 25°C will result in a trough 15 of from 25 to 30 microns in depth for a window width of from 10 to 500 microns. The etched body 10 is rinsed in distilled water and blown dry. Preferably, a gas such, for example, as freon, argon and the like, is suitable for drying the processed body 10.

The processed body 10 is disposed in a metal evaporation chamber. A metal layer 17 is deposited on the remaining portions of the layer 11 of silicon oxide and on the exposed silicon in the troughs 15. The metal in the troughs 15 are the metal "wires" to be migrated through the body 10. The metal of the layer 15 comprises a material, either substantially pure in itself or suitably doped by one or more materials to impart a second and opposite type conductivity to material of the body 10 through which it migrates. The thickness of the layer 17 is approximately equal to the depth of the trough 15. Therefore, if the trough 15 is 20 microns deep, the layer 17 is approximately 20 microns in thickness. A suitable material for the metal layer 17 is aluminum to obtain P-type regions in N-type silicon semiconductor material. Prior to migrating the "metal" wires in the troughs 15 through the body of silicon 10, the excess metal of the layer 17 is removed from the silicon oxide layer 11 by such suitable means as grinding away the excess metal with 600 grit carbide paper.

It has been discovered that the vapor deposition of the layer 17 of aluminum metal should be performed at a pressure of approximately $1 \times 10^{-5}$ torr but not greater than $5 \times 10^{-5}$ torr. When the pressure is greater than $5 \times 10^{-5}$ torr, we have found that in the case of aluminum metal deposited in the troughs 15, the aluminum does not penetrate into the silicon and migrate through the body 10. It is believed that the layer of aluminum is saturated with oxygen which prevents the reduction of a thin layer of silicon oxide, formed when the silicon surface is exposed to air, by the aluminum and thus, a good wetting of the contiguous surfaces of silicon. A good close intimate contact is required between the material of the body 10 and the metal of the layer 17 to enable good diffusion of the materials into each other upon the initiation of the heating cycle. Otherwise the initial melting and alloying of aluminum with silicon required for migration is not obtained because of the inability of aluminum atoms to diffuse into the silicon interface. In a like manner, aluminum deposited by sputtering is not as desirable because sputtered aluminum appears to be saturated with oxygen. The preferred methods of depositing aluminum on the silicon body 10 are by the electron beam method and the like wherein little, if any, oxygen can be trapped in the aluminum.

The processed body 10 is placed in a thermalmigration apparatus, not shown, and the "metal" wires in the troughs 15 are migrated through the body 10 by a thermal gradient zone melting process. A thermal gradient of from approximately 50°C per centimeter to approximately 200°C per centimeter between the bottom surface 14, which is the hot face, and the surface 12, which is the cold face, has been discovered to be appropriate for an average temperature of the body 10 from 700°C to 1350°C. The process is practiced for a sufficient length of time to migrate all the metal wires through the body 10. For example, for aluminum "wires" of 20 microns thickness, a thermal gradient of 50°C/cm, a temperature of the body 10 of 1100°C, and a pressure of $1 \times 10^{-5}$ torr, a furnace time of less than 12 hours is required to migrate the wires through a silicon body 10 of 1 centimeter thickness.

The temperature gradient zone melting process and apparatus is not a part of this invention. For a more thorough understanding of the temperature gradient zone melting process employed in this invention and for a more thorough description of the apparatus employed for the process, one is directed to copending applications of Thomas R. Anthony and Harvey E. Cline and others entitled Method of Making Deep Diode Devices, Pat. No. 3,901,736; Deep Diode Device Production and Method, Ser. No. 411,021; Deep Diode Devices and Method of Apparatus, Ser. No. 411,001 now abandoned in favor of Ser. No. 552.154; High Velocity Thermomigration Method of Making Deep Diodes, U.S. Pat. No. 3,898,106; Deep Diode Device Having Dislocation-Free P-N Junctions and Method, U.S. Pat. No. 3,902,925; and The Stabilized Droplet Method of Making Deep Diodes Having Uniform Electrical Properties, U.S. Pat. No. 3,899,361 which are assigned to the same assignee of this invention.

Figure 2:
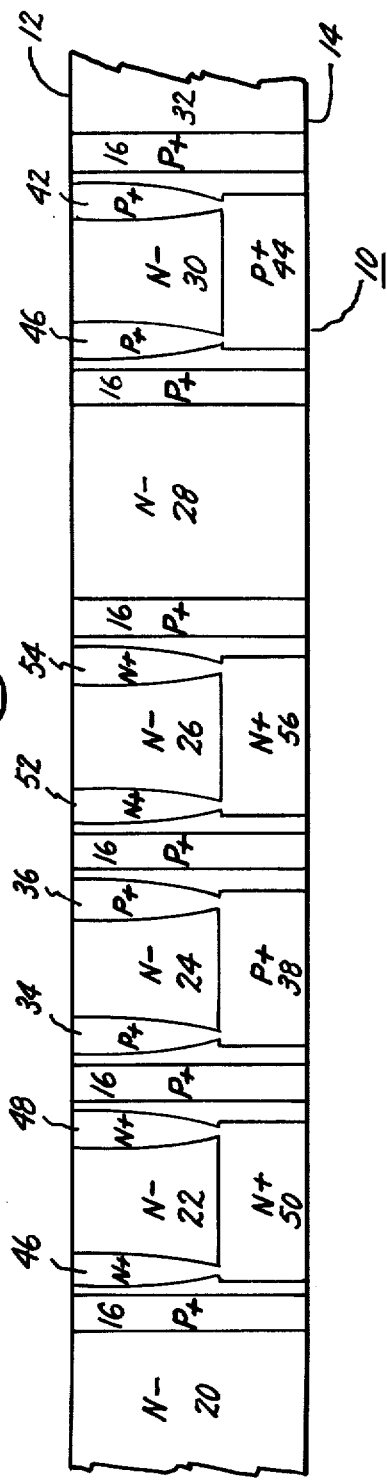

Upon completion of the temperature gradient zone melting process, the aluminum "wires" which have migrated through the body 10 onto the surface 14 are removed by selective etching or grinding. The resulting processed body 10 is as shown in FIG. 2. The thermal migration of the metal wires in the troughs 15 through the body 10 produces a body 10 having a lamellar structure of a plurality of spaced regions 16 of a second and opposite type conductivity than the body 10. Each region 16 is recrystallized material of the body 10 suitably doped with a material comprising the metal wire and having an impurity concentration sufficient to obtain the desired conductivity. The metal retained in the recrystallized region is the maximum allowed by the crystalline structure of the material through which it has migrated. It is semiconductor material with a maximum solid solubility of the impurity therein. It is not semiconductor material which has eutectic material therein, and it is not an alloy of the impurity and the semiconductor materials. The region 16 has a substantially constant uniform level of impurity concentration throughout the entire planar region. The thickness of the region 16 is substantially constant for the entire region. The peripheral surface of each planar region 16 comprises in part the reprocessed top surface 12, the bottom surface 14 and the peripheral side surfaces of the body 10.

Additionally, the body 10 is divided into a plurality of spaced regions 20 through 32, each having the same or first type conductivity as the body 10. P-N junction 18 is formed by the contiguous surfaces of each pair of mutually adjacent regions 16 and 22 through 32 of opposite type conductivity. At a processing temperature of 1100°C, the number of acceptors decreases from $2 \times 10^{19}$ to the background concentration of $5 \times 10^{14}$, but the concentration of donors in the N material is sufficient to form a P-N junction 18 which is abrupt and distinct. At a lower processing temperature, the junction 18 is even more abrupt.

Alternately, the regions 16 may be formed after the devices are formed in the body 10. The process of forming the regions 16 is such that little noticeable changes occur in the device structures since the process time for regions 16 is of the order of 10 to 15 minutes.

Further, this invention has been described relative to practicing thermal gradient zone melting in a negative atmosphere. However, it has been discovered that when the body of semiconductor material is a thin wafer of the order of 10 mil thickness, the thermal gradient zone melting process may be practiced in an inert gaseous atmosphere of hydrogen, helium, argon and the like in a furnace having a positive atmosphere.

The migration of metal wires is preferably practiced in accordance with the planar orientations, thermomigration directions, stable wire directions and stable wire sizes of Table I.

Table I

| Wafer Plane | Migration Direction | | Stable Wire Directions | Stable Wire Sizes |
|---|---|---|---|---|
| (100) | <100> | | <011>*<br><01$\bar{1}$>* | <100 microns<br><100 microns |
| (110) | <110> | | <1$\bar{1}$0>* | <150 microns |
| (111) | <111> | +a) | <0$\bar{1}$1><br><$\bar{1}$01><br><1$\bar{1}$0> | <500 microns |
| | | b) | <11$\bar{2}$>*<br><$\bar{2}$11><br><1$\bar{2}$1> | <500 microns |
| | | c) | Any other direction in (111) plane* | <500 microns |

*The stability of the migration wire is sensitive to the alignment of the thermal gradient with the <100>, <110> and <111> axis, respectively.
+Group a is more stable than group b which is more stable than group c.

The desired power devices and signal or control devices are fabricated in the regions 20 through 32 by practicing standard semiconductor processing techniques including selective masking of the surfaces 12 and 14 of the body 10. Whenever possible, all deep diffusions are practiced simultaneously. When P and N type diffusion is required, first one type, than the other is predeposited and both driven simultaneously. The diffusion practice is carried out whenever possible, in a manner such that when the last region of the device having the least depth beneath a surface is formed, all the other diffused regions reach their desired depth within at the same time. Photolithographical techniques followed by selective etching and predeposition and driving of suitable dopant materials into the material of the regions 20 through 32 are practiced to form the necessary regions of conductivity of each of the devices to be fabricated. Whenever possible, all like regions of the same type conductivity in the various devices are formed in the body 10 simultaneously. Whenever various depths of the same or opposite type conductivity regions are required, they are processed sequentially and the final depth of each region achieved by the final diffusion drive of the region of the devices having its portion of a P-N junction, which is substantially parallel to the top and bottom surfaces 12 and 14, respectively, at the least depth beneath the respective surface 12 and/or 14.

The technique of sequential predeposition and simultaneously driving of P and N type dopants is to minimize the thermal excursions of the body 10 in order to maximize the lifetime of the material of the structure and the individual devices therein when the overall device is completed.

In order to explain the invention more clearly, and with reference to FIGS. 2 through 5, the further processing of the body 10 will be described relative to the formation of a photodiode in region 22, a P-N-P bipolar power transistor in region 24, an N-P-N bipolar power transistor in region 26, an N-P-N signal bipolar transistor in region 28 and a power semiconductor control rectifier in region 30. Referring now to FIG. 2, p$^+$ and N$^+$ type conductivity sinker regions 34 through 44 and 46 through 56, respectively, are formed in the respective regions 22, 24, 26 and 30. Preferably, the dopant materials are deposited on selected areas of both surfaces 12 and 14, exposed in windows of a silicon oxide layer, sequentially the material for the P$^+$ type conductivity regions 34 through 44 being deposited first. In a similar processing technique as practiced before, a suitable dopant such, for example, as boron is deposited upon selected surface areas of the surfaces 12 and 14 at a temperature of from about 1000°C to 1100°C. Dry oxygen is then caused to flow through the furnace over and about the body 10 being processed to form an oxide, a borosilicate glass, to seal the dopant material therein until the body 10 is brought up to a temperature of from approximately 900°C to 1100°C. This slow oxidation process enables one to diffuse the dopant impurity part way into the body 10. When the body 10 has reached the higher temperature range, the oxygen is bubbled through water maintained at a temperature of approximately 95°C, in a method well known to those skilled in the art, and caused to flow over and about the body 10 for aout one-half hour to grow a silicon oxide layer of about ½ micron on the body 10 to mask the same against the predeposition of N-type dopant material to follow. A minimum thickness of from 5000A to 8000A is desired for the minimum protection desired. Upon completion of the oxide growth, nitrogen is caused to flow through the furnace over and about the processed body for approximately 10 to 20 minutes to cool the wafers slowly to preserve the lifetime of the material of the body 10.

The body 10, upon completion of cooling in the flowing nitrogen, is prepared for an N-dopant material predeposition. In a similar manner, as practiced heretofore, windows are opened in oxide mask to expose selected areas of the surfaces 12 and 14 of the body 10. A suitable dopant material such, for example, as phosphorous derived from phosphorous oxichloride, phosphorous tin chloride, phosphorous glass or phosphorous gas, is deposited on the exposed selective surface areas. The surface concentration of the N-type dopant material deposited is from $10^{20}$ to $10^{21}$ atoms per cubic centimeter. In the same manner as previously described relative to the P-type dopant material, an oxide layer is grown over the N-type dopant material which is partially diffused into the body 10. Subsequently, the body is heated to a temperature of from 1200°C to 1250°C for a sufficient time to simultaneously form the N$^+$ type regions 46 through 56 and the P$^+$ type regions 34 through 44.

It is to be understood, however, that when the regions being formed by diffusion extend to different depths beneath the respective surfaces 12 and 14, the predeposition and drive of the dopant impurities must be sequentially performed in a predetermined manner whereby the final diffusion or drive operation achieves the desired depth for each of the regions of P$^+$ and N$^+$ type conductivity being formed.

With reference to FIG. 3, sequential processing is practiced in the same manner as before to form the N-type conductivity region 58, the P-type regions 60 and 62 and the P$^+$ type regions 64, 66 and 68. Sequential practicing is practiced again in the same manner as described heretofore to complete the basic structure of the devics of the processed body 10. In this sequence of process steps N$^+$ type conductivity regions 70, 72 and 74 are formed in the body 10 as shown in FIG. 4.

Referring now to FIG. 4, the material of body 10 has been processed to provide a homogeneous integrated power structure embodying one or more power devices and one or more signal or control devices in a common substrate. It is to be understood that we define a semiconductor power device as having electrical characteristics of an operating voltage of 500 or more volts and a current capacity of 1 or more amperes and a control or signal device as a semiconductor device having electrical characteristics of an operating voltage of less than 500 volts and an operating current of less than 1 ampere. For example, the device as fabricated in region 22 may function as a photodiode 76 when properly contacted by electrical leads. A radiant energy source impinging upon the surface area 78 of the region 64 will cause the diode 76 to function. A P-N junction 80 is formed by the contiguous surfaces of the regions 64 and 22 of opposite type conductivity. An electrical contact is affixed to regions 46 and 48 which may be individual or one complete means of contacting the buried layer region 50 of the photodiode 50. The region 50 is diffused to a depth of from 20 to 100 microns and the region 64 is diffused to a depth of from 10 to 30 microns. The electrical characteristics of the diode 76 are those of a standard diffused photodiode in that the junction between regions 64 and 22 collect the photon generated carriers if its depth is properly designed to take into account the absorption of photons by the silicon and the diffusion of carriers. The photodiode is activated by impinging radiation having a wavelength of from 2000A to 12,000A.

Within the region 24, a P-N-P bipolar power transistor 82 is formed by the processing described heretofore. The region 38 is diffused to a depth of from 100 to 120 microns, the region 66 is diffused to a depth of from 60 to 80 microns and the base width is from 5 to 25 microns when the initial thickness of the body 10 is about 200 microns. A P-N junction 84 is formed by the abutting surfaces of the regions 24 and 66 of opposite type conductivity and has a portion thereof exposed in the surface 12. The electrical characteristics of the power transistor 82 are not as well controlled as those as the N-P-N transistors 86 and 92. This is because the base width cannot be as well controlled and the collector region 38 is more heavily doped than would be desired for the collector region of a discrete P-N-P transistor. Because of this, the collector-base breakdown voltage of transistor 82 is from 50 to 300 volts. The transistor has a "reach through" characteristic in that the depletion region of the junction between regions 38 and 24 extends upward until it touches the emitter region 66. The $H_{FE}$ of the device can, however, be made reasonably large, say 50–200. This structure has the lowest forward saturation voltage of the group because of the symetry of the emitter and collector regions 66 and 38.

An N-P-N power bipolar transistor 86 is formed in the region 26. The $N^+$ type region 56 diffused into the region 26 from 20 to 100 microns. The P-type region 60 is diffused into the region 26 from 10 to 30 microns and is the base region of the transistor 86. The $N^+$ type region 70 is diffused from 5 to 10 microns into the P-type region 60 and is the emitter region of the transistor 86. The region 56 and the remaining portion of the region 26 between the regions 56 and 60 is the collector region of the transistor 86. The region 56 is a low electrical resistance contact region for the device 86. P-N junctions 88 and 90 are formed by the abutting surfaces of the respective pairs of mutually adjacent regions 26 and 60 and 60 and 70. Each portion of the P-N junctions 88 and 90 ae exposed in the surface 12 of the processed body 10.

The electrical characteristics of the device 86 are those of a discrete N-P-N power bipolar transistor except that the contact to the collector of this transistor can be made at the top surface 12. The collector-base breakdown is 500 volts or more for a 25 ohm-centimeter N-region 26 and can be varied by varying the characteristics of region 26. The base width 60 is well controlled and the $H_{FE}$ (current gain) of the device 86 is specified as any nominal value which is required for design purposes. Such, for example, any value from 10 to 100.

An N-P-N signal or control bipolar transistor 92 is formed in the region 26. The N-type region 58 is diffused into the region 28 a depth of from 20 to 40 microns and together with the remaining portion of the region 28, after processing, functions as the collector of the device 92. The P-type region 68 is diffused into the N-type region 58 a depth of from 10 to 30 microns and is the base region of the device 92. The $N^+$ type region 72 is the emitter region of the device 92 and is diffused into the $P^+$ type region 68 to a depth of from 5 to 10 microns. P-N junctions 94 and 96 are formed by the abutting surfaces of the pairs of respective regions 58 and 68 and 68 and 72. End portions of the P-N junctions 94 and 96 are exposed in the surface 12. The electrical characteristics of the device 92 are those of a triple diffused integrated circuit signal bipolar transistor. The collector-base breakdown is controlled by the N-region 58 and is considerably lower than the collector-base breakdown of transistor 86, it being of the order of, for example, 10–50 volts. However, the collector contact for this transistor can be made at the top surface 12 because of diffusion 58. This is true even though there is no bottom $N^+$ diffusion. The base width of this transistor 92 can be well controlled by the diffusions 68 and 72. The low current characteristics of the device 92 can be made reasonably linear by standard diffusion techniques.

A power semiconductor controlled rectifier 98 is formed in the region 30 of the processed body 10. The $N^+$ type region 74 is the emitter region of the device 98 and is diffused into the P-type region 62 a depth of from 5 to 10 microns. The P-type region 62 is diffused into the N-type region 30 a depth of from 20 to 120 microns and functions as a gate region for the device 98. The $P^+$ type region 44 is the anode region of the device 98 and is diffused into the N-type region a depth of from 10 to 80 microns. P-N junctions 100, 102, 104 and 106 are formed by the abutting surfaces of mutually adjacent pairs of respective regions 30 and 62, 62 and 74, 30 and 44 and 30 and 40. Selected end portions of the P-N junctions 100, 102 and 106 are exposed in the surface 12. Selected end portions of the P-N junctions 104 are exposed in the surface 14. The electrical characteristics of the semiconductor controlled rectifier 98 are, for instance, the width of region 30, and its associated diffusion length is the major determinative of the $H_{FE}$ of the P-N-P part of the device. The width of region 62 and the emitter efficiency of region 74 determines the $H_{FE}$ of the N-P-N part of the device 98. In addition, these parameters can be controlled by the addition of partial shorts (shorted emitters) at the top surface 12. The main difference between device 98 and a discrete thyristor is the ability to contact the $P^+$ region 44 at the top surface 12 using diffused regions 40 and 42.

The processed body 10 comprises devices which have a planar configuration. Preferably, all electrical contacts are affixed to selective surface areas of the devices 76, 82, 86, 92, 98 and the like. Therefore, with reference to FIG. 5, one or more layers 108 of the same or different type electrical insulating materials such, for example, as silicon oxide, silicon nitride, aluminum nitride and the like are deposited on selected areas of the surfaces 12 and 14 of the body 10. An ohmic electrical contact 110 is affixed to selected surface areas of selected regions of the devices 76, 82, 86 and 92 and 98 coextensive with the surface 12. Electrical leads are then affixed to the contacts in a suitable way to provide electrical connections and to between individual devices or two or more of the devices embodying the homogeneous integrated power structure. A layer of a suitable material such, for example, as polycrystalline silicon, is deposited on the layer 108 on the surface 14 to provide a suitable means for maintaining the homogeneous integrated power structure on a mounting surface, in a package and the like.

As described heretofore, the homogeneous integrated power structure of this invention provides an excellent means for providing an inline means for reducing household voltages of the range from 110 volts to 125 volts, to a voltage level suitable for operating low voltage household appliances. Of particular importance, is the fact that an economical, reliable, small power converting package is now available for operating low voltage household appliances off of standard household circuits and voltages.

Figure 6:
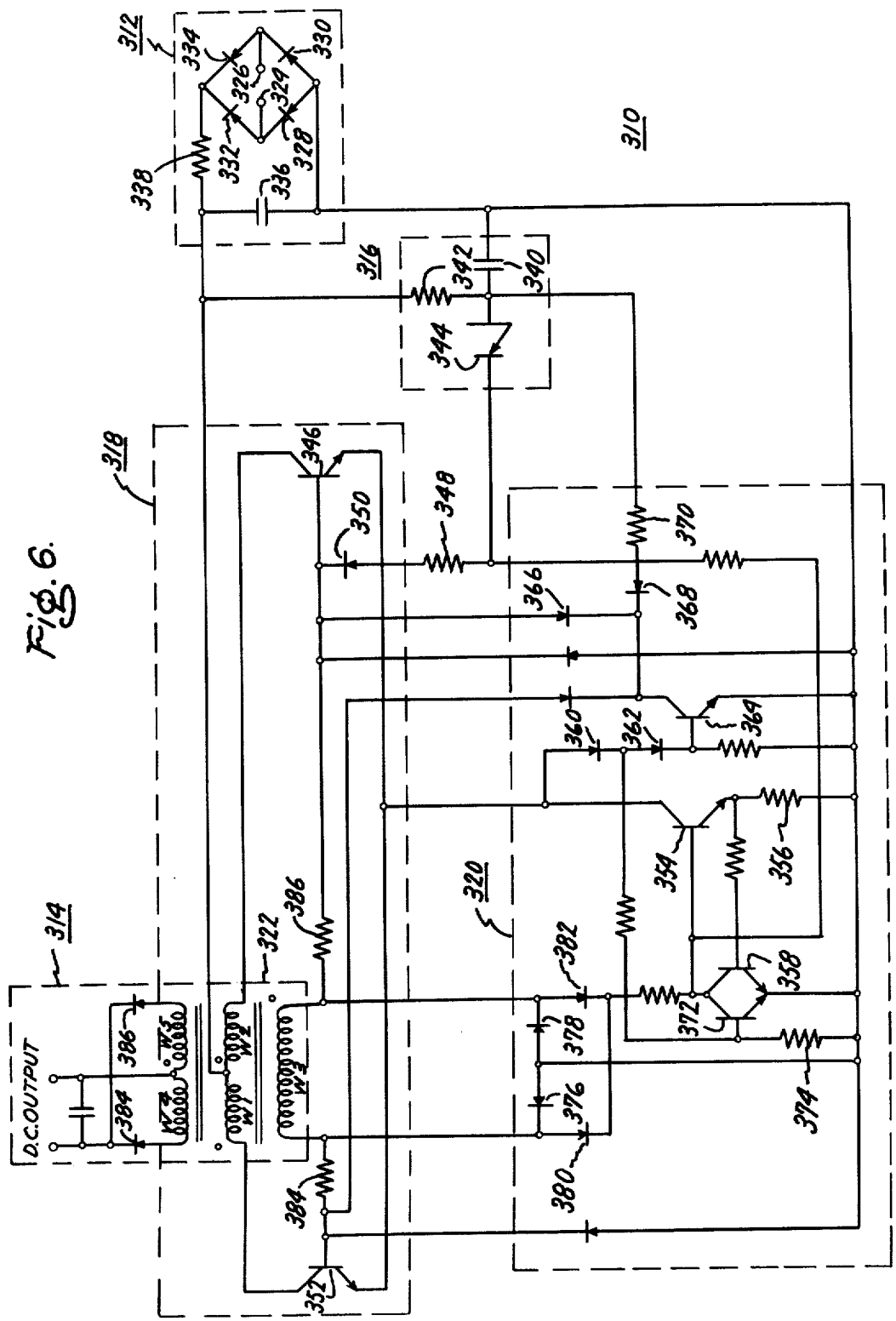
FIG. 6 is an electrical schematic of an integrated circuit made in accordance with the teachings of this invention.

Referring now to FIG. 6, there is shown a schematic diagram of a 10 watt-line operated inverter 310 embodying high frequency techniques. The circuit arrangement of the inverter 310 has five major circuits 312, 314, 316, 318 and 320, which are an input rectifier stage 312, an output rectifier state 314, a starting circuit stage 316, a power switching stage 318, and a switching control circuit stage 320.

The power inverter stage 312 operates at approximately 25k Hertz and employs the saturating characteristics of a transformer 322 for frequency control and to obtain regenerative or self-sustained oscillation. The power switching stage 312, if it employed this aforementioned principle alone, would be expected to exhibit high switching losses due to high peak transistor currents and "soft" base circuit turn-off characteristics. The power switching stage 318 combined with 320 as shown avoids these undesirable characteristics.

Briefly, the circuit is functional when AC power is applied to input terminals 324 and 326 and rectified by diodes 328 through 334. Capacitor 336 is charged substantially instantaneously. Resistor 338 of about 1 ohm is provided in the circuit 312 to protect capacitor 336 from current stages in the circuit 312. Capacitor 340 is charged to approximately 18 volts in the starting circuit stage 316 which comprises a resistor 342 of approximately $10^{16}$ ohms and a breakover voltage sensitive switch 334 which is a unilateral switch. When capacitor 340 is charged to about 18 volts, the breakover voltage of switch 334 is reached and the stored charge of capacitor 340 is dumped into the base of transistor 346 through resistor 348 and diode 350 and initiates conduction in the power switching circuit stage 318.

Upon initiation of conduction in the power switching circuit stage 318, current via base drive winding W3 of transformer 322 and transistor 352 is applied to the base of transistor 354 and transistor 354 conducts. Current flowing through transistor 354 via resistor 356, of approximately 4 ohm resistance, functions as an excitation and load current and ferrite transformer 352 saturates abruptly. Upon saturation of the core of the transformer 352, the flow of current through resistor 356 increases abruptly resulting in an increase of applied potential to the base of transistor 358 to initiate conduction of transistor 358. Transistor 358 turns-on and upon saturation pulls the base drive away from transistor 354 turning off transistor 354.

However, the current flowing through 354 is in an inductive circuit and consequently, has a tendency to continue flowing. The continuing flow of current is diverted through diodes 360 and 362 and is applied to the base of transistor 364 and causes transistor 364 to turn on hard.

The turning on of transistor 364 reduces the base drive of transistor 346 diverting the collector current of transistor 346 from the emitter to the base thereof through diode 366 and transistor 364, thereby effectively turning off transistor 346. Additionally, the turning on of transistor 364 also discharges the capacitor 340 through diode 368 and resistor 370 thereby preventing the starting circuit from interferring with the normal operation of the power transistors 346 and 352, each preferably having a $V_{CBO}$ rating of approximately 500 volts.

Meanwhile, the load current which had been diverted from transistor 354 via diode 360 is partially diverted to the base of transistor 372 and turns on the transistor 372. The turning on of transistor 372 keeps the transistor 354 turned off. A leakage path resistance of approximately 1000 to 2000 ohms is provided for the base of the transistor 372 by resistor 374. The polarity of the transformer 322 is reversed and the current which was flowing through the winding W2 is now caused to flow through winding W1.

A rectifying bridge including diodes 376 through 340 for the potential applied to the base of the transistor 354. The rectifying bridge provides a base drive for transistor 354 which is independent of the polarity of the power switching circuit, that is the polarity of the winding W3. Resistors 384 and 386 are current limiting resistors of approximately 2000 ohms each.

The primary windings of W1 and W2 of the transformer 322 have an applied potential of about 350 volts at about twice the applied peak line voltage. The secondary windings W4 and W5 have approximately a 20 volt peak to peak potential for a desired output voltage of 10 volts full wave rectified DC output via diodes 384 and 386. A DC load may then be applied across the output terminals 388 and 390 of the circuit stage 314.

Except for transistors 346 and 352, all of the transistors in the inverter circuit 310 each have a $V_{CBO}$ rating of approximately 40 volts. Therefore, we have found that by employing the homogeneous integrated power structure of this invention we can successfully incorporate the inverter circuit 310, embodying both signal and power devices, and except for the transformer 322 and the output voltage circuit 314 (because of safety requirements only), in one semiconductor chip.

We claim as our invention:

1. A homogeneous integrated power structure including:

a body of semiconductor material having two major opposed surfaces forming respectively the top and bottom surfaces of the body, a predetermined level of resistivity, a predetermined first type conductivity, a predetermined lifetime, and a vertical axis substantially perpendicular to the major opposed surfaces;

at least one of the major opposed surfaces having a preferred crystal planar orientation;

a plurality of planar regions disposed in the body and extending between, and terminating in, the opposed major surfaces, and being oriented in a direction aligned with a first preferred crystal axis of the crystal structure of the material of the body;

each planar region having two major opposed surfaces oriented substantially perpendicular to the major opposed surfaces of the body and substantially parallel to the vertical axis of the body and a second preferred crystal axis of the material of the body;

the planar regions are oriented with respect to each other so that selected ones thereof at least intersect, and are integral, with, each other so as to divide the body into a plurality of spaced regions of the original material of the body;

the material of each planar region is of a predetermined second and opposite type conductivity and consists of recrystallized semiconductor material of the body;

the recrystallized material of each planar region is formed in situ by the migration of a melt of metal-rich semiconductor material of the body by thermal gradient zone melting at a predetermined elevated temperature along a thermal gradient aligned substantially parallel with the second predetermined crystal axis and the vertical axis of the body, the metal of the melt is substantially uniformly distributed throughout the recrystallized material of the region and has a predetermined uniform level of concentration which is determined by the solid solubility limits of that metal in that semiconductor material at that predetermined elevated temperature of migration;

the metal of the melt consisting of at least one dopant impurity material to impart the type conductivity and resistivity to the recrystallized material of the planar region;

a plurality of P-N junctions electrically isolating the spaced regions from each other;

each P-N junction being formed by the abutting contiguous surfaces of each major surface of a planar region and the material of the body, an end portion of each P-N junction being exposed at the opposed major surfaces of the body;

at least one signal or control semiconductor device having an electrical characteristic of functioning at less than 1 ampere and at less than 500 volts formed in one of the spaced regions;

at least one power semiconductor device having an electrical characteristic of functioning at no less than 1 ampere and at no less than 500 volts, and electrical circuit means for electrically connecting together all the semiconductor devices formed in the body.

2. The homogeneous integrated power structure of claim 1 wherein the at least one dopant impurity material is aluminum, and the semiconductor material is silicon of N-type conductivity.

3. The homogeneous integrated power structure of claim 1 wherein the at least one of the opposed major surfaces of the body has a preferred crystal planar orientation which is one selected from the group consisting of (111), (110) and (100).

4. The homogeneous integrated power structure of claim 3 wherein the preferred crystal planar orientation is (100), and each planar region has a first preferred crystal axis which is at least one selected from the group consisting of $<011>$ and $<0\bar{1}1>$ and a second preferred crystal axis of $<100>$.

5. The homogeneous integrated power structure of claim 3 wherein the preferred crystal planar orientation is (110), and each planar region has a first preferred crystal axis of $<1\bar{1}0>$ and a second preferred crystal axis of $<110>$.

6. The homogeneous integrated power structure of claim 3 wherein the preferred crystal planar orientation is (111), and each planar region has a second preferred crystal axis of $<111>$.

7. The homogeneous integrated power structure of claim 6 wherein each planar region has a first preferred crystal axis which is at least one selected from the group consisting of $<01\bar{1}>$, $<10\bar{1}>$, $<1\bar{1}0>$, $<11\bar{2}>$, $<\bar{2}11>$ and $<1\bar{2}1>$.

8. The homogeneous integrated power structure of claim 2 wherein the predetermined lifetime of the material of the body is of the order of approximately 100 microseconds.

9. The homogeneous integrated power structure of claim 8 wherein the resistivity of the material of the body is approximately 15 ohm-centimeter.

10. The homogeneous integrated power structure of claim 8 wherein the resistivity of the material of the body is approximately 25 ohm-centimeter.

11. The homogeneous integrated power structure of claim 8 wherein the resistivity of the material of the body is approximately 40 ohm-centimeter.

* * * * *